United States Patent
Graf (10) Patent No.: US 6,586,305 B2
(45) Date of Patent: Jul. 1, 2003

(54) METHOD FOR PRODUCING TRANSISTORS IN INTEGRATED SEMICONDUCTOR CIRCUITS

(75) Inventor: Werner Graf, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/223,034

(22) Filed: Aug. 16, 2002

(65) Prior Publication Data

US 2003/0049906 A1 Mar. 13, 2003

(30) Foreign Application Priority Data

Aug. 16, 2001 (DE) .......................... 101 40 047

(51) Int. Cl.$^7$ ............................. H01L 21/336
(52) U.S. Cl. .................. 438/275; 438/279; 438/592
(58) Field of Search .................. 438/221, 275, 438/279, 296, 588, 592, 258, 200, 241, FOR 187, FOR 193

(56) References Cited

U.S. PATENT DOCUMENTS

| 6,015,730 A | 1/2000 | Wang et al. |
| 6,037,222 A | 3/2000 | Huang et al. |
| 6,087,225 A | 7/2000 | Bronner et al. |
| 6,235,574 B1 | 5/2001 | Többen et al. |
| 6,509,587 B2 * | 1/2003 | Sugiyama et al. .......... 257/192 |

FOREIGN PATENT DOCUMENTS

JP 2000 357 749 A 10/2000

* cited by examiner

*Primary Examiner*—George Fourson
*Assistant Examiner*—Thanh V Pham
(74) *Attorney, Agent, or Firm*—Laurence A. Greenberg; Werner H. Stemer; Ralph E. Locher (57) ABSTRACT

Integrated semiconductor circuits have MOS transistors whose gate electrodes are provided with dopings in order to set the electrical potential of the channel area by changing the ionization energy (work function) of the electrons. Transistors in semiconductor circuits, which have both a memory area and a logic area, are produced either using different dopings for pMOS and NMOS transistors in the logic area (dual work function) or using common source/drain electrodes in the memory area (borderless contact), with all the transistors in the semiconductor circuit receiving the same gate doping in the latter case. A method is proposed by which a dual work function and a borderless contact can be produced at the same time. Furthermore, the method results without any additional effort in a trench between the gate layer stacks of the memory area and of the logic area, which prevents lateral ion diffusion.

15 Claims, 4 Drawing Sheets

METHOD FOR PRODUCING TRANSISTORS IN INTEGRATED SEMICONDUCTOR CIRCUITS

BACKGROUND OF THE INVENTION

Field of the Invention

The invention relates to a method for producing an integrated semiconductor circuit.

During the production of integrated semiconductor circuits, transistors are formed on a semiconductor substrate. The normal transistors at the moment are generally metal oxide semiconductor field effect transistors (MOSFETs), whose center electrode, a gate electrode, is structured from a layer sequence of layers deposited on a substrate. Source and drain electrodes are then implanted into the substrate, on both sides of the gate electrode. The gate electrode essentially governs the switching response of the transistor. The desired switching response depends on the task associated with that transistor. In particular, the circumstance as to whether the transistor is a memory transistor for a memory cell or a logic transistor, which has to satisfy relatively stringent requirements for the transistor performance and in some circumstances also has to process analog signals, has major effects on the construction of the transistor, in particular on the composition of its gate layer stack.

Memory transistors that are produced using present-day technologies have, for example, a 60 to 80 nm thick lowermost gate layer on the gate oxide, which is covered by a nitride layer with a thickness, for example, of 200 nm.

Adjacent transistors on the substrate surface are generally disposed such that they are physically separated, and thus each has an individual source connection and a drain connection. In contrast, transistors for memory cells may be produced in pairs at a short distance from one another, with their adjacent gate layer stacks being separated only by a narrow area, which is used as a source contact or drain contact for both transistors at the same time. The electrode connection for connection of the common diffusion region is then introduced into the small space between the adjacent gate layer stacks. Since the gate oxide layer must be removed from the substrate surface between the gate layer stacks during this process, an etching process is carried out, in order to make it possible for the common electrode to make electrical contact between the adjacent gate layer stacks. The gate layer stack is itself attacked during the etching process, and this is undesirable. For this reason, the gate layer stack is protected by a thick nitride layer, which is deposited as the uppermost layer even before it is structured. During the subsequent etching process in order to make contact with the substrate implantations, the nitride layer protects the entire gate layer stack.

Transistors produced in this way may be disposed a short distance apart from one another in the areas of the substrate surface which are memory areas, and may be provided with a common source connection or drain connection. This construction in pairs is referred to as a borderless contact, and is used exclusively in the memory area, where the requirements for the switching response of the transistors are less stringent than in the logic area. Although the same transistors are produced in both areas, they are, however, produced a short distance apart from one another in pairs in the memory area, thus reducing the substrate surface area which is required for a memory cell. This allows particularly small memory cells to be produced.

In order to improve the switching response of a transistor, it is nowadays normal to dope the lowermost layers of a gate layer stack by ion implantation. Admittedly, in contrast to the situation with the source electrode and drain electrode, which are formed only by the introduction of implantations into the substrate, implantation of the gate electrode is not absolutely essential, since the gate electrode is used only to produce an electrical field through the gate oxide layer. However, the electrical potential of the channel area of the substrate located under the gate layer stack can be optimized by varying the electrical potential of the gate layer located above it. Such a potential shift is carried out, in a corresponding manner to the band scheme for electronic systems in solid bodies, by introducing dopings that cause an energy band shift in.the gate electrode. The band shift leads to a change in the ionization energy of the electrons in the lowermost gate layer at the boundary with the gate oxide located underneath it. The change in the ionization energy (work function) results in a change in the electrical potential of the channel area.

A band shift of a different magnitude is required depending on the type of transistor; in particular, it may be positive or negative.

N-channel transistors whose channel is formed by negative charge carriers are provided with n-doping for the gate electrode. In contrast, p-channel transistors are provided with p-doping. Different dopings for the n-channel transistors and p-channel transistors is optimum in cMOS circuits (complementary MOS).

Difficulties occur as soon as one integrated semiconductor circuit contains both memory transistors and logic transistors. Many modern integrated circuits, for example application specific integrated circuits (ASICs) contain memory areas that are referred to as embedded dynamic random access memories (embedded DRAMs) and are surrounded by logic areas. The two areas are produced by one and the same production process. In particular, the transistors for both areas are manufactured by one common process method.

In the memory area where the memory transistors are intended to be manufactured as far as possible using a borderless contact construction, that is to say in pairs with a common electrode between the gate layer stacks, the gate layer must be protected against contact etching by a thick nitride layer, typically with a thickness of 200 nm. In order to limit the depth of the contact to be filled in between the closely adjacent gate layer stacks, the lowermost gate layer, generally polysilicon, is deposited with a small layer thickness of only 60 to 80 nm. The small thickness results in that implantations cannot be introduced into the gate layer subsequently for an additional covering layer, without precluding doping of the channel area in the substrate. The doping must therefore be introduced into the gate at the same time that the layer is deposited. The polysilicon is thus deposited at the same time as the gate doping as the lowermost gate layer. In this method, the transistors that are to be manufactured in the memory area can be manufactured in pairs with a borderless contact.

In the logic area, whose transistors are manufactured at the same time as the transistors for the memory area, the construction of integrated circuits has the disadvantage that the same gate implantation is introduced in all the logic transistors, both in the n-channel transistors and in the p-channel transistors, and the gate implantation is matched to the memory transistors—generally exclusively n-channel transistors—which are disposed in the memory area. The p-channel transistors that are likewise disposed in the logic area thus receive negative doping in their gate electrodes, which results in a non-optimum ionization energy (work function) for the electrons in their gate layer.

This construction of an integrated semiconductor circuit with gate layer stacks which are optimized for transistors that are densely packed in pairs (borderless contact) in the memory area, both in the memory area and in the logic area, is referred to as a single work function structure, since the same value is set for the ionization energy in the lower gate layer and in the gate oxide in all the transistors in the integrated semiconductor circuit.

However, this structure is disadvantageous in the logic area.

In particular as transistors become increasingly physically smaller, with a lower operating voltage, the respectively optimum matching of the ionization energy, and hence the dual work function structure, become ever more important.

If, on the other hand, the transistors in the integrated semiconductor circuit are intended to be manufactured using a dual work function structure, then two different dopings must be introduced into the lowermost gate layer. Therefore, all the transistors are provided with a considerably thicker lowermost gate layer with a thickness of about 200 nm. Specifically, since different dopings must be introduced for the p-channel transistors and for the n-channel transistors, these cannot be introduced at the same time as the deposition of the gate layer, but must be implanted into them subsequently. Two corresponding implantation processes are carried out for this purpose, with the transistors that are not intended to be implanted in each case being covered by a mask. In order to preclude doping of the channel regions under the lowermost gate layer, the layer must have a thickness of, typically, at least 200 nm, in order to make it possible to reliably prevent the implantations from penetrating into the channel area underneath the gate oxide.

The subsequent implantation prevents the use of the thick isolation layer in the memory area, as is required for the borderless contact. The construction of an integrated semiconductor circuit with a dual work function, that is to say with two values for the ionization energy of the electrons from the respective gate, results in that it is impossible to manufacture the transistors in the memory area with a borderless contact structure, that is to say with a common source/gate electrode, and these must be disposed physically separately from one another, so that each memory cell thus requires a considerably larger substrate area.

Thus, according to the prior art, a dual work function and a borderless contact are mutually exclusive. Semiconductor circuits that have both a memory area and a logic area are produced using one of these alternative construction methods. With regard to the necessary memory capacity, the construction process frequently makes use of a borderless contact, but preferably only with a single work function, in which the p-channel transistors (which are contained exclusively in the logic area) are also provided with the gate n-doping that is disadvantageous for them. It would be desirable to be able to produce transistors with both a borderless contact structure and a dual work function structure on a single semiconductor substrate.

SUMMARY OF THE INVENTION

It is accordingly an object of the invention to provide a method for producing transistors in integrated semiconductor circuits which overcomes the above-mentioned disadvantages of the prior art methods of this general type, in which integrated semiconductor circuits can be produced with transistors which are configured as transistor pairs with a borderless contact structure in a memory area and are configured with a dual work function structure, that is to say in each case having different gate dopings for transistors of different conductivity types, in a logic area. The aim is thus to produce a borderless contact and a dual work function jointly on a single semiconductor substrate.

With the foregoing and other objects in view there is provided, in accordance with the invention, a method for producing of an integrated semiconductor circuit. The method includes providing a semiconductor substrate having a first surface area and a second surface area being adjacent to the first surface area, applying a first conductive layer to the semiconductor substrate, and producing a first covering layer on the first conductive layer. The first covering layer extends over the first surface area of the semiconductor substrate. A second conductive layer is applied over the first covering layer and the first conductive layer. A second covering layer is applied on the second conductive layer in the second surface area of the semiconductor substrate. The second covering layer is separated by a boundary area of a predetermined minimum width from a boundary between the first surface area and the second surface area. An etching process is carried out to remove the second conductive layer selectively with respect to the first covering layer and with respect to the second covering layer, as a result of which the second conductive layer, and also the first conductive layer in the boundary area are removed, and a trench is formed between the first covering layer and the second covering layer.

The method according to the invention makes it possible to apply different gate layer stacks for transistors by a single combined coating process and to form a boundary area between them, which separates the two surface areas from one another, in the first surface area of the substrate which corresponds to a memory area, and in the second surface area which corresponds to a logic area. The first conductive layer is applied to the semiconductor substrate. The conductivity of the first conductive layer is in this case not subject to any stringent requirements; it is sufficient for the first conductive layer to be suitable, in conjunction with further layers located on top of it, for use as a lower layer of a gate electrode (currently, for example, polycrystalline polysilicon is used in conjunction with metal layers). The first conductive layer is used as a lower gate layer, and is applied to the semiconductor substrate in both surface areas. The first covering layer is produced above it, in the first surface area. This is done, for example, by depositing the first covering layer on the entire semiconductor substrate and by etching it back again outside the first surface area. After this, the first conductive layer of the gate layer stack, that is deposited in both surface areas, is covered by the first covering layer only in the memory area. The second conductive layer is then applied in both surface areas. In the second surface area, this covers the first conductive layer of the gate layer stack, while in contrast it covers the first covering layer in the first surface area.

The second covering layer is then applied to the second layer in the second surface area, the logic area. There, the second covering layer is applied only sufficiently far that it is removed between the first surface area and the second surface area except for a predetermined minimum separation from the boundary. The second covering layer, which is disposed in this way, is once again deposited by deposition over the entire surface followed by etching back, with the predetermined minimum separation from the boundary between the memory area and the logic area being made possible by a laterally suitably disposed mask. Once the second covering layer has been formed exclusively in the logic area, the memory area is covered by.the second conductive layer, from which the gate layer stack in the logic area is intended to be formed. In the boundary area between the memory area and the logic area, the second conductive layer is slightly deeper, by virtue of the covered first covering layer that ends there. The second, exposed covering layer of the logic area follows behind the boundary area. In the last step of the method according to the invention, an etching process is carried out, which etches the first and the second conductive layer in the gate layer stack, but not the first and the second covering layer. The layer stack containing the lower, first conductive layer, the second conductive layer and the second covering layer thus remains unchanged in the logic area. In contrast, in the first surface area, the memory area, the exposed second conductive layer is etched back until the first covering layer, covered by it, is exposed. The first conductive layer, which was deposited first, is located underneath this.

Two different layer sequences, which have been produced using a single process, are thus located in the memory area and in the logic area on the substrate. Only the first conductive layer is located under the first covering layer in the memory area, while the second conductive layer is also located, above the first, under the second covering layer in the logic area. This allows different, in particular higher, gate electrodes to be produced than in the memory area, where the second conductive layer has been etched back again.

In addition, the method according to the invention also results in a trench being etched between the gate layer stack for the memory area and that for the logic area, specifically by continuing the etching of the second conductive layer until the first conductive layer is also removed in the boundary area of the predetermined minimum width. While a suitable mask must normally be structured for the structuring of a trench, the invention makes use of the fact that covering layers must be deposited both in the memory area and in the logic area. Each of the covering layers requires it's own mask. In particular, the invention makes use of the fact that, in those surface areas in which neither the first nor the second covering layer remains on the substrate, only the first and the second layer, which can both be etched selectively with respect to the covering layers, remain on the substrate. Since the second covering layer is disposed set back laterally by a so-called offset with respect to the boundary between the first and the second surface area, so that a boundary area of a predetermined minimum width remains, in which the second surface area is not covered by the second covering layer, the boundary area can be etched back as far as the substrate surface, since neither the first nor the second covering layer occurs there. The covering layers form the side boundaries of a trench which is formed during the etching process, with the second covering layer being exposed from the start, and the first covering layer being exposed in the course of the etching process. According to the invention, the etching process is also continued after the first covering layer has been exposed, until the layer that was deposited is also etched back in the boundary area between the memory area and the logic area. This results in a trench between the different gate layer stacks in the two surface areas and, in particular, this offers the advantage that it prevents lateral ion diffusion after the implantation of the two gate layer sequences. Such lateral ion diffusion could occur if the substrate was heated to relatively high temperatures and ions introduced into the gate layers were to diffuse laterally into the respective other gate layer sequence.

The method according to the invention makes it possible to produce different gate layer sequences on different surface areas of a single substrate and, furthermore, to separate them by a trench. In this case, no specific mask is required to form the gate stack trench at the boundary between the two surface areas, and this reduces the production costs.

The invention preferably provides for a barrier layer to be deposited in the trench, to prevent ion diffusion between the first and the second surface area. This covers the exposed layer sequences in particular on the sidewalls of the trench such that, if the temperature is increased during the rest of the method, no external ions can penetrate into the gate layer sequences from the side.

The barrier layer on the bottom of the trench and in the first and second surface areas outside the trench is preferably removed by anisotropic etching. During the anisotropic etching process, the barrier layer is removed again only on surfaces which run horizontally on the substrate surface, but not on the sidewalls of the gate layer stack on the trench, where protection against the ingress of ions is most important.

The first covering layer is preferably also removed by the anisotropic etching. This results in the first conductive layer being exposed again in the memory area and, at a time at which the trench is formed between the first conductive layer and the second conductive layer, this can then be provided with doping which is suitable for the memory area, and which is implanted into the first conductive layer. The gate layer stack for the logic area is also covered by the second covering layer. The second covering layer shields the doping that is intended for the memory area.

In order to produce gate structures in the memory area, in which the first conductive layer is now doped, a third conductive layer, preferably a metal layer, is deposited over the etched-free first conductive layer, and the first conductive layer is structured together with the metal layer to form gate electrodes.

In this case, a fourth, insulating layer is preferably also deposited on the metal layer, and is then structured at the same time as the layers of the memory gate electrodes located underneath. After this, the gate structures are produced in the memory area while, in the logic area, the first and the second conductive layers, which still need to be doped, are covered by the second covering layer, the metal layer and, possibly, the insulating layer.

An embedded DRAM is preferably produced in the first surface area.

Once the embedded DRAM has been produced in the first surface area, the second covering layer in the second surface area can be exposed. The second covering layer and the first and second conductive layers located underneath it together form the layer stack, which can now be processed further in the logic area.

Different dopings are preferably introduced successively into different subregions of the second surface area, with n-doped gate electrodes for n-channel transistors being structured in a first subregion, and p-doped gate electrodes for p-channel transistors being structured in a second subregion. This allows a dual work function logic circuit to be produced on a substrate that has memory transistors with a borderless contact structure in the memory area. The method according to the invention, in which different layer structures are produced in the memory area and in the logic area by two covering layers located at different levels on the substrate and by the etching back in the memory area as far as the first covering layer, allows borderless contact and dual work function to be combined on a single semiconductor substrate.

In order to provide better protection for the boundary area against ion diffusion between the memory area and the logic area, one development of the invention provides for trench isolation (shallow trench isolation) to be introduced into the semiconductor substrate before the introduction of the first conductive layer onto the semiconductor substrate. Although a trench is formed between the different layer sequences in the boundary area, and is preferably also covered by an ion diffusion layer, it is possible, when heated for a lengthy time in an oven, for ions to diffuse through the substrate underneath the trench from the memory area to the logic area, or vice versa. The shallow trench isolation introduced there prevents this.

In order, in addition, to preclude ion diffusion through the gate oxide, a further development of the invention provides for the gate oxide to be removed and for the trench isolation to be exposed during the etching process to form the trench between the first covering layer and the second covering layer. The diffusion barrier layer is then located directly on the shallow trench in the trench, so that the memory area and the logic area are completely shielded against ions diffusing between them.

Since, according to the invention, the trench is intended to provide a diffusion barrier against lateral ion diffusion, the invention provides for the first conductive layer and the second conductive layer in the boundary area to be removed by a single uninterrupted etching process.

Finally, the invention provides for the doping to be implanted into the first conductive layer once the barrier layer has been removed in the first surface area.

Other features which are considered as characteristic for the invention are set forth in the appended claims.

Although the invention is illustrated and described herein as embodied in a method for production of transistors in integrated semiconductor circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
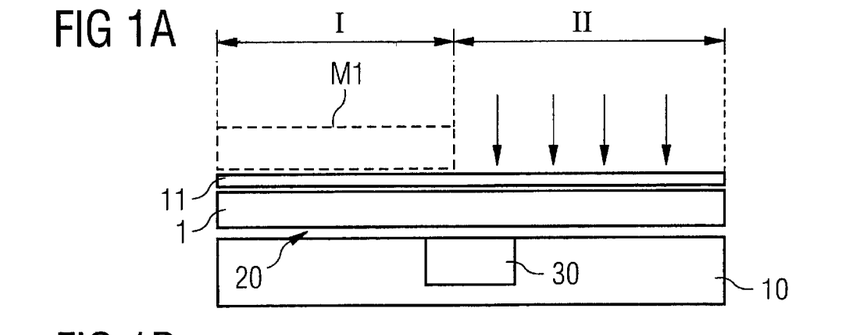
FIGS. 1A to 1H, 1J to 1N and 1P are diagrammatic, sectional views of different stages for producing a transistor according to the invention.

Referring now to the figures of the drawing in detail and first, particularly, to FIG. 1A thereof, there is shown a semiconductor substrate 10 on whose gate oxide 20 a first layer 1, which is intended to act as a gate layer in both surface areas I and II of the semiconductor substrate 10, and, above it, a covering layer 11 are deposited. Shallow trench isolation 30, which is introduced before the deposition of the layers 1, 11, is used to prevent ion diffusion between the first and the second surface area I, II in the substrate 10 during subsequent high temperature steps. In order to make it possible to produce different gate structures in the two surfaces areas I, II with the aid of the single conductive layer 1, the covering layer 11 is etched away in the surface area II by an etching process represented by appropriate arrows. During the etching process, the covering layer 11 in the surface area I is protected by a mask layer M1 which is shown by dotted lines and is removed again after the etching process. After this, the covering layer 11 is now located only in the surface area I, in which memory cells are intended to be produced later.

Figure 1B:
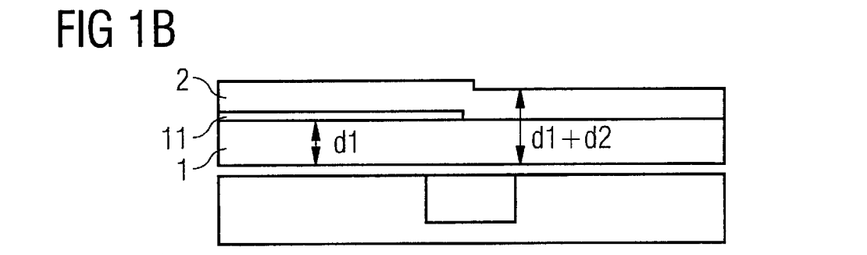

If a second conductive layer 2 is deposited onto the structure obtained in this way, then this results in the structure illustrated in FIG. 1B. In the same way as the layer 1, the layer 2 is electrically conductive, and is preferably composed of the same material as the layer 1, for example of polysilicon, and is used to form other, in particular higher, gate structures later in the surface area II. However, it is deposited over both surface areas.

Figure 1C:
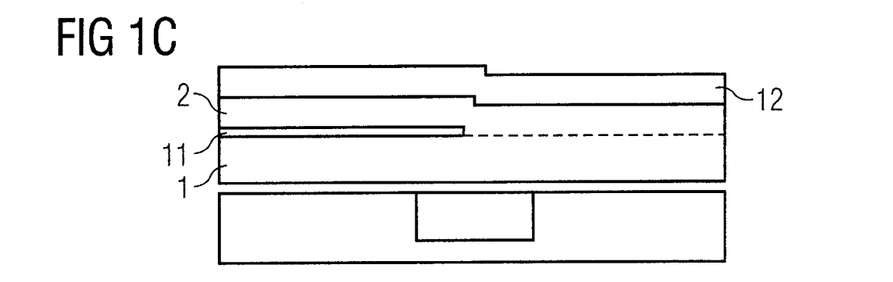

A second covering layer 12 is deposited as shown in FIG. 1C. The covering layer 12 is used to protect the gate layer, which is a combination of the conductive layers 1 and 2 in the surface area II, during subsequent process steps. Since the second covering layer 12 is required only in the surface area II, in which logic transistors are intended to be produced later, it must be removed from the surface area I.

Figure 1D:
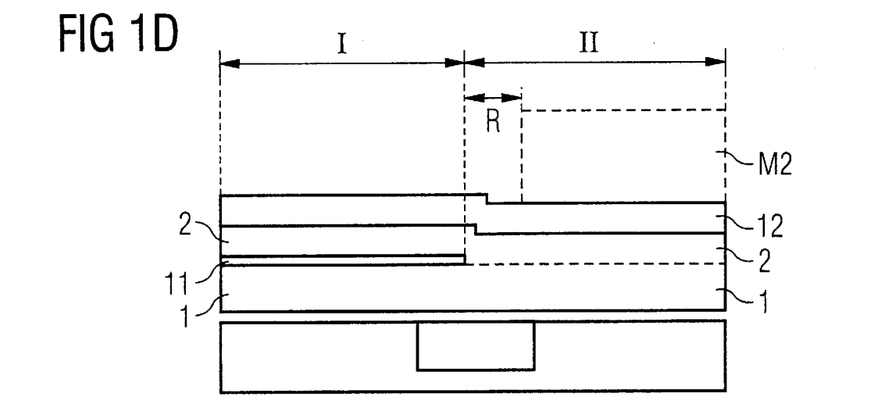

A mask M2, which is represented by dashed lines in FIG. 1D and is located only in the surface area II, is used for this purpose. According to the invention, use is first made of the fact that gate layer stacks, whose lowermost layer 1 extends over both surface areas I and II, can be produced with the aid of two covering layers, which cover two different surface areas I, II. Once the gate structures have been formed over the entire area for the surface area I, there is no need once again to completely remove the layer stack produced in the surface area II. Instead of this, a major proportion of the gate layer stack in the surface area II can actually be produced during the production of the layer structure in the surface area I if, as is illustrated in FIG. 1, it is protected with the aid of a second mask M2 during the structuring (which is still to be explained) in the surface area I.

The invention also makes use of the fact that a trench can be etched between the surface areas I and II with the aid of the two covering layers 11, 12, without any additional third mask.

Figure 1E:
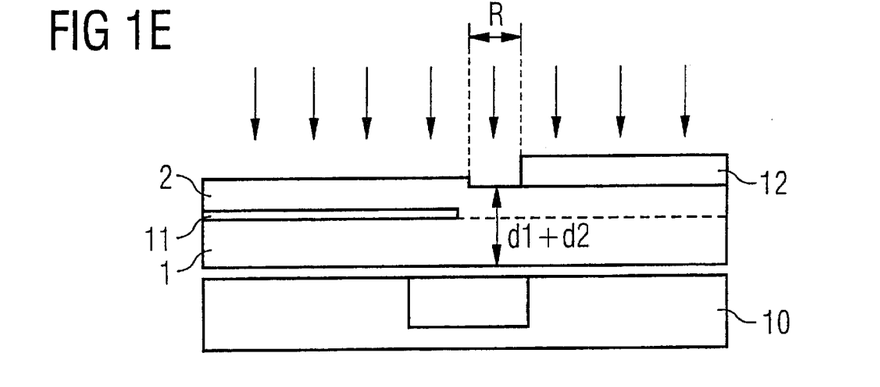
Figure 1F:
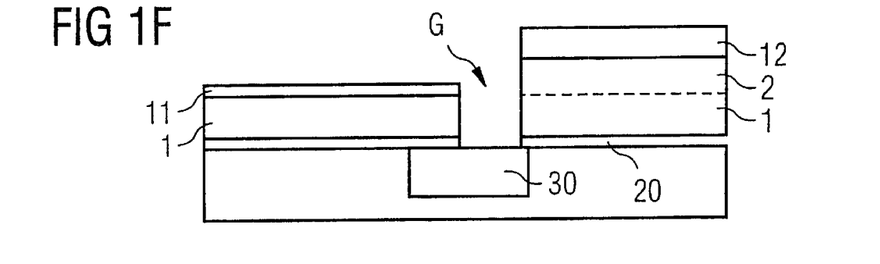
Figure 1G:
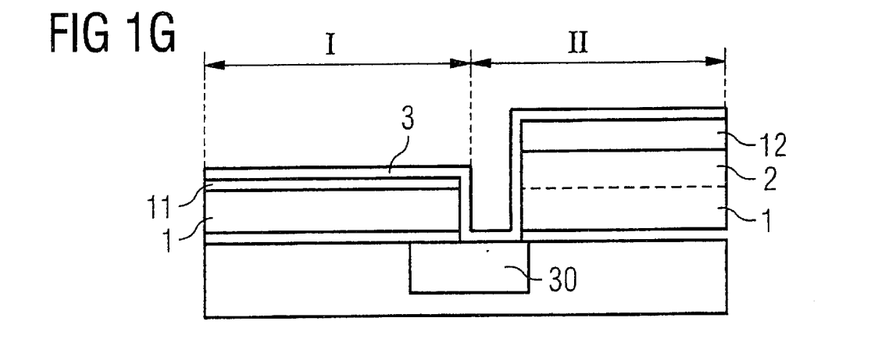
Figure 1H:
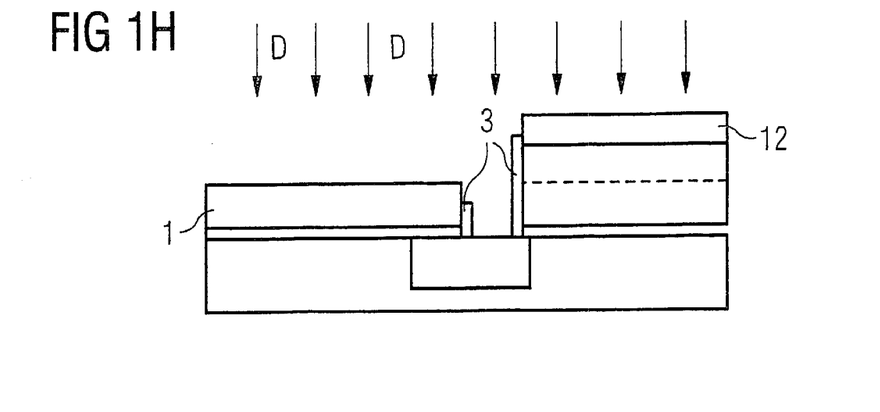

The formation of the trench is illustrated in FIGS. 1E to 1H. As shown in FIG. 1E, the second covering layer 12 is disposed at a distance from the boundary between the first surface area I and the second surface area II, by a boundary area R with a predetermined width. Neither the first covering layer 11 nor the second covering layer 12 runs in the boundary area R, and the second conductive layer 2 and the first conductive layer 1, which is located underneath it, are open. At this point, the semiconductor structure can be etched back as far as the surface of the semiconductor substrate 10, and this is made use of according to the invention, as a result of which the first or the second conductive layer 1, 2 is interrupted and, as is illustrated in FIG. 1F, a trench is formed whose upper edges are formed by the covering layers 11 and 12. The trench is preferably also etched through the gate oxide 20, so that, at the bottom, it is bounded only by the initially introduced shallow trench isolation 30. However, if the gate oxide 20 is formed by oxidation of the substrate material, the gate oxide layer exists from the start only at the side of the shallow trench isolation. If, as is illustrated in FIG. 1G, the semiconductor structure is now covered by a barrier layer 3, then it is possible during further process steps to completely prevent diffusion of ions, which still need to be introduced, between the surface area I and the surface area II, with the aid of the barrier layer 3, through which ions cannot pass, and the shallow trench isolation 30. However, and as illustrated in FIG. 1H, the barrier layer 3 is etched back at right angles to the substrate 10 by anisotropic etching, until the barrier layer 3 remains only on the side walls of the two layer stacks. The remaining barrier layer protects the side walls during the subsequent process against the ingress of ions into the conductive layers 1 or 1 and 2, from which the gate structures are intended to be produced.

Figure 1J:
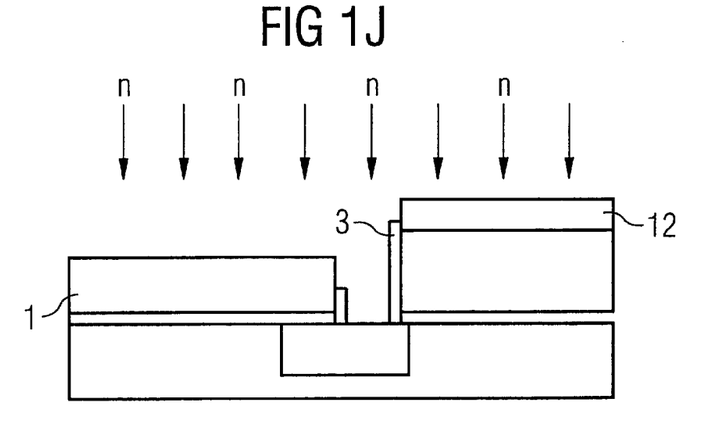
Figure 1K:
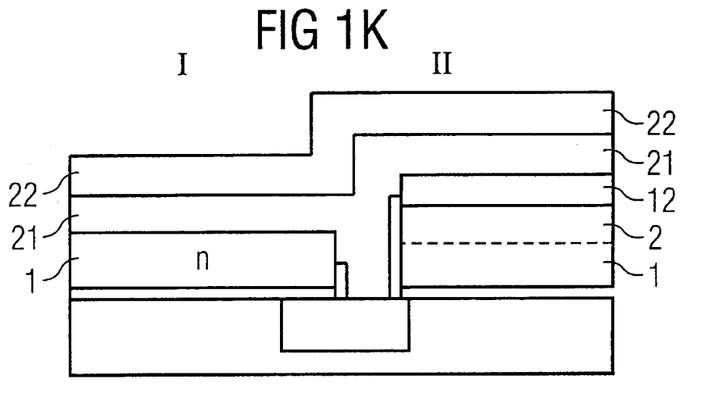

The etching back of the barrier layer 3 is preferably continued until the first covering layer 11 is likewise removed in the surface area I. The first conductive layer 1 is thus exposed in FIG. 1H and, as is illustrated in FIG. 1J, can be doped by ion implantation with a doping D. During the implantation, the second surface area II is still covered by the second covering layer 12, which protects the conductive layers 1, 2 located underneath against implantation. As an alternative to this, the first surface area I may also be doped by depositing a non-illustrated doped layer and whose doping is subsequently introduced into the layer 1 by a heat treatment process. In the logic area II, the second covering layer 12 which is still present there and the diffusion barrier layer 3 prevent the second gate layer sequence from being doped. A third conductive layer 21 is then deposited onto the structure illustrated in FIG. 1J, with an insulating layer 22 being deposited on top of the third conductive layer 21. The structure produced in this way is illustrated in FIG. 1K. The layers 21 and 22 are used exclusively to complete the gate layer sequence in the surface area I. In the surface area II, the gate layer sequence is formed only from the layers 1 and 2 and the covering layer 12. In FIG. 1K, these layers are still covered by the layers 21 and 22.

Figure 1L:
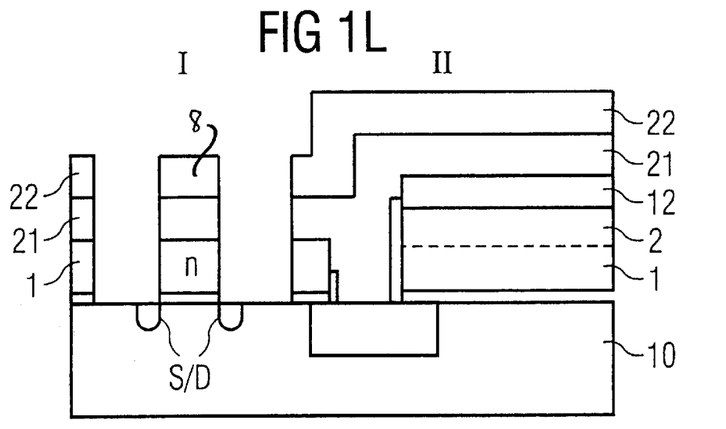

As shown in FIG. 1L, the gate layer stack is structured in the surface area I, so that individual gate stacks 8 are produced on which memory transistors can be formed. This is done by introducing appropriate dopings in those areas in which the gate layer stack 8—in the case of the surface area I containing the layers 1, 21 and 22—is etched back, and the substrate 10 is exposed.

Figure 1M:
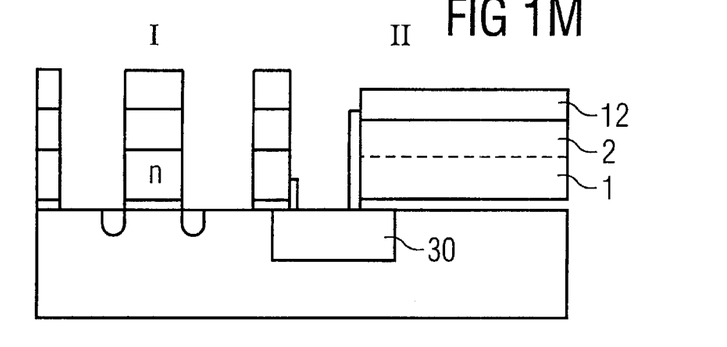

Once all the doping stages have been introduced into the surface area I, resulting in the production of the source and drain connections S/D, which are illustrated only schematically and not to scale in FIGS. 1L to 1P, and the completion of the transistors for the memory cells, the gate layer stack may be structured in the logic areas. For this purpose, the layers 21 and 22 are removed again, resulting in the structure that is illustrated in FIG. 1M. The second covering layer 12 over the electrically conductive layers 2 and 1 is exposed once again in the surface area II. Further dopings, that in particular are different to those in the memory area I, may now be implanted there.

Figure 1N:
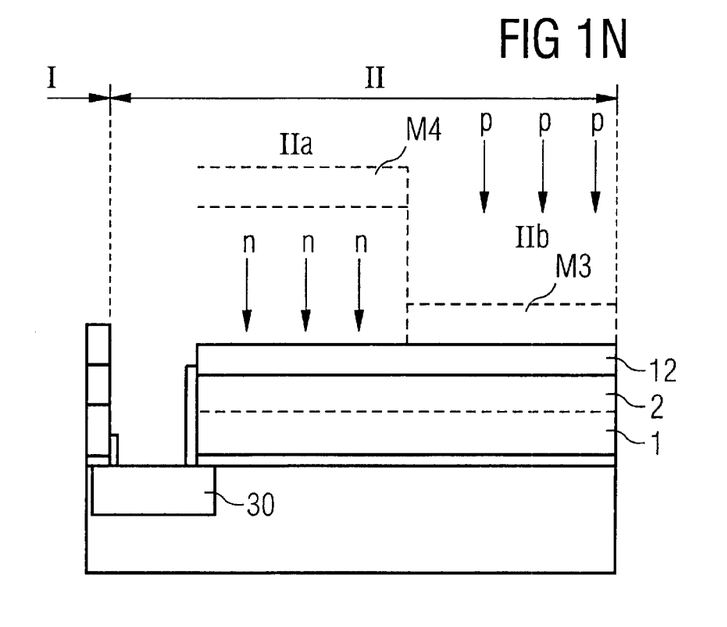

FIG. 1N illustrates a larger detail of the surface area II on which, illustrated schematically by use of two mask layers M3, M4 which are illustrated on different subregions, different dopings n, p are implanted successively. By way of example, an n-doping is first introduced in a subregion IIa, for which purpose the rest of the surface area II is covered by the mask M3. The mask M3 is then removed, another mask M4 is applied in the area that has just been doped, and the remaining subregion IIb of the second surface area II is doped. In this case, a doping is preferably introduced which contains charge carriers with the opposite mathematical sign to the doping which was introduced in the first subregion IIa; that is to say, in this case, p-doping. This results in the electrically conductive layers 2 and 1 being doped in accordance with a dual work function structure for the transistors.

Figure 1P:
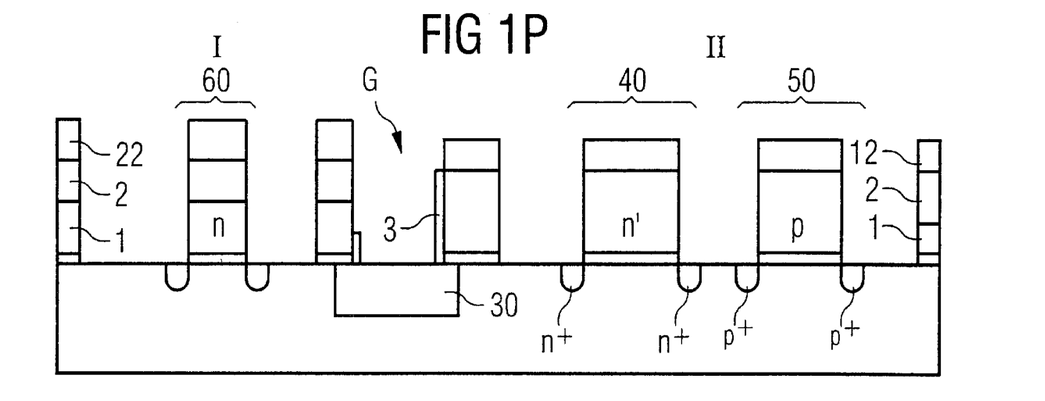

Now, as is illustrated in FIG. 1P, suitable structuring in the surface area II makes it possible to produce both transistors with an n-doped gate and transistors with a p-doped gate. FIG. 1P shows, to represent this, one n-channel transistor 40 and one p-channel transistor 50, whose gate layers 1 and 2 are doped differently. The n-doping of the gate of the n-channel transistor 40 is different to that of the memory transistor 60 produced in the memory area I, and is thus annotated n'.

The method according to the invention allows all three dopings n, n' and p to be introduced into one and the same layer 1, which forms the lowermost gate layer over the entire substrate surface. There is no need to etch back the layer 1 in the surface area II once again, in order subsequently to produce the complete layer stack for the logic area II.

Furthermore, the trench G and the barrier layer 3 on the boundary between the layer stack in the surface area I and in the surface area II prevent lateral ion diffusion. Ion diffusion occurs when the ion profile in the doped layers is optimized immediately after implantation of the ions. During such diffusion processes, which are brought about thermally, lateral diffusion may occur. However, this is suppressed by the trench and by the buried isolation 30 between the different gate layer stacks in the memory area I and in the logic area II.

The shallow trench isolation preferably has a width of 100 to 1000 nm, and a depth likewise of 100 to 1000 nm. Polysilicon is preferably used as the material for the conductive layers 1 and 2, and is deposited with a thickness of between 20 and 200 nm for the layer 1 and likewise with a thickness of between 20 and 200 nm for the layer 2. The first covering layer 11 preferably has a thickness of between 10 and 100 nm, while the second covering layer 12 has a thickness of between 10 and 200 nm. The width of the boundary region at the edge of the surface area II, which corresponds to the trench width, is preferably at least as large as the layer thickness of the second covering layer 12, preferably between 200 and 400 nm more than its layer thickness. The isolation trench G, by which the different gate layer stacks are separated during the production process, is formed without the assistance of any further masks by an offset, that is to say by setting back the covering layer 12 with respect to the boundary between the first.surface area I and the second surface area II.

The semiconductor circuits that can be produced with the aid of the method according to the invention preferably have MOSFETs whose gate-layer doping differs depending on the surface area I or II in which they are disposed and on their conductance type. The different gate dopings n, n' and p each produce a different ionization energy for the electrons to the gate oxide, and thus specifically change the potentials of the respective channel regions.

I claim:

1. A method for producing of an integrated semiconductor circuit, which comprises the steps of:

providing a semiconductor substrate having a first surface area and a second surface area being adjacent to the first surface area;

applying a first conductive layer to the semiconductor substrate;

producing a first covering layer on the first conductive layer, the first covering layer extending over the first surface area of the semiconductor substrate;

applying a second conductive layer over the first covering layer and the first conductive layer;

producing a second covering layer on the second conductive layer in the second surface area of the semiconductor substrate, the second covering layer being separated by a boundary area of a predetermined minimum width from a boundary between the first surface area and the second surface area; and carrying out an etching process to remove the second conductive layer selectively with respect to the first covering layer and with respect to the second covering layer, as a result of which the second conductive layer, and also the first conductive layer in the boundary area are removed, and a trench being formed between the first covering layer and the second covering layer.

2. The method according to claim 1, which comprises depositing a barrier layer for preventing ion diffusion between the first surface area and the second surface area, in the trench.

3. The method according to claim 2, which comprises removing the barrier layer from a bottom of the trench, the first surface area, and the second surface area outside the trench by anisotropic etching.

4. The method according to claim 3, which comprises removing the first covering layer using an anisotropic etching process.

5. The method according to claim 4, which comprises depositing a third conductive layer over the first conductive layer which has been etched-free.

6. The method according to claim 5, which comprises structuring the first conductive layer and the third conductive layer to form gate electrodes in the first surface area.

7. The method according to claim 6, which comprises implanting a doping into the first conductive layer in the first surface area at a time when the trench is formed between the first conductive layer and the second conductive layer.

8. The method according to claim 1, which comprises producing a semiconductor memory in the first surface area.

9. The method according to claim 8, which comprises exposing the second covering area in the second surface area after completion of the semiconductor memory in the first surface area.

10. The method according to claim 9, which comprises introducing different dopings successively into different subregions of the second surface area, with n-doped electrodes for n-channel transistors being produced in a first subregion of the second surface area, and p-doped electrodes for p-channel transistors being produced in a second subregion of the second surface area.

11. The method according to claim 1, which comprises introducing a trench isolation into the semiconductor substrate before an application of the first conductive layer to the semiconductor substrate in the boundary area between the first surface area and the second surface area.

12. The method according to claim 11, which comprises:

forming the semiconductor substrate with a gate oxide; and during the etching process to form the trench between the first covering layer and the second covering layer, removing the gate oxide resulting in the trench isolation being exposed.

13. The method according to claim 1, which comprises removing from the boundary area, the first conductive layer, and the second conductive layer with a single uninterrupted etching process for forming the trench.

14. The method according to claim 7, which comprises implanting the doping into the first conductive layer once the barrier layer in the first surface area has been removed.

15. The method according to claim 1, which comprises producing an embedded dynamic random access memory in the first surface area.

* * * * *